United States Patent [19]

Baise et al.

[11] 4,339,526
[45] Jul. 13, 1982

[54] ACETYLENE TERMINATED, BRANCHED POLYPHENYLENE RESIST AND PROTECTIVE COATING FOR INTEGRATED CIRCUIT DEVICES

[75] Inventors: Arnold I. Baise, Poughkeepsie; George Czornyj, Wappingers Falls, both of N.Y.; Anthony W. Wu, San Jose, Calif.

[73] Assignee: International Business Machines Corporation, Armonk, N.Y.

[21] Appl. No.: 276,850

[22] Filed: Jun. 24, 1981

[51] Int. Cl.$^3$ .................... H01L 21/94; H01L 21/312
[52] U.S. Cl. .................................. 430/296; 430/281; 430/286; 430/311; 430/319; 430/329; 430/330; 427/96; 427/82
[58] Field of Search ................... 427/82, 96; 430/281, 430/286, 296, 311, 319, 329, 330

[56] References Cited

U.S. PATENT DOCUMENTS

| | | | |
|---|---|---|---|
| 3,627,529 | 12/1971 | Frank et al. | 96/33 |
| 3,822,134 | 7/1974 | Rasch et al. | 96/94 R |
| 3,882,073 | 5/1975 | Cessna, Jr. | 260/33.6 |
| 4,017,340 | 4/1977 | Yerman | 427/82 |
| 4,164,458 | 8/1979 | Patel | 204/159.17 |
| 4,238,528 | 12/1980 | Angelo | 427/96 |
| 4,247,613 | 1/1981 | Ott | 430/286 |
| 4,262,073 | 4/1981 | Pampalone | 430/296 |

FOREIGN PATENT DOCUMENTS 56-17024  2/1981  Japan ..................... 427/82

*Primary Examiner*—John D. Smith
*Attorney, Agent, or Firm*—Joseph G. Walsh

[57] ABSTRACT

A protective coating is formed on an integrated circuit device by coating the device with a solution of acetylene terminated, branched polyphenylene prepolymer material and heating the material to form a thermoset crosslinked polymer layer. Selectively patterned portions may be provided when, after the coating step and prior to the heating step, the steps of imagewise exposure to radiation and rinsing with an organic solvent are carried out.

3 Claims, No Drawings

ACETYLENE TERMINATED, BRANCHED POLYPHENYLENE RESIST AND PROTECTIVE COATING FOR INTEGRATED CIRCUIT DEVICES

DESCRIPTION

1. Technical Field

The present invention is concerned with a protective layer to be used to provide low dielectric constant insulating passivation for integrated circuit devices. In one variation of the present invention, a high temperature functional negative resist is formed. The materials used in the present invention are acetylene terminated, branched polyphenylene prepolymer materials.

2. Background Art

Acetylene terminated, branched polyphenylene prepolymer materials are known in the art. Their preparation is described, for example, in U.S. Pat. No. 3,882,073. Such materials are commercially available from Hercules Incorporated under the trademark "H-Resin."

It is known from the prior art that materials containing acetylenic groups can be crosslinked by exposure to radiation. (See, for example, U.S. Pat. Nos. 3,627,529; 3,822,134; and 4,164,458).

As far as we are aware, however, the prior art contains no suggestion of the use of acetylene terminated, branched polyphenylene materials as dielectric or radiation patternable resist layers for integrated circuit manufacture.

DISCLOSURE OF THE INVENTION

The present invention provides a protective coating for integrated circuit devices. The protective coating is a high temperature, low dielectric constant material providing both insulation and passivation. It is useful in such areas as magnetic bubbles and the 1μ packaging technology.

According to the present invention, the electric device to be protected is first coated with a solution in an organic solvent of an acetylene terminated, branched polyphenylene prepolymer. The prepolymer is soluble in many common aromatic solvents as well as in most ethers, ketones, aldehydes and chlorinated hydrocarbons. Because of its branch structure, it is in fact highly soluble in such solvents and solutions containing over 50% by weight of solute can easily be formed and still possess low viscosity. The excellent solubility properties are taken advantage of to spin-coat extremely uniform films onto various substrates. Diglyme is a particularly preferred solvent.

When it is so desired, the flow properties of the resin below 120° C., i.e. before curing commences, can be improved by the presence of a low molecular weight fluidizing and solubilizing component such as 1,4-diphenylbutadiyne. This fluidizing aids in the formation of planarized structures.

Following the coating step, the prepolymer is heated. Upon heating it acts through the terminal acetylene groups to form a totally insoluble crosslinked structure. It should be noted that the curing occurs without the evolution of any volatile by-product. Many other coating materials emit volatile by-products such as water, upon curing. The absence of such a by-product is a particular advantage of the present invention, since it allows the formation of defect-free films possessing low void densities.

The fully cured material is a low surface energy hydrophobic material possessing excellent chemical resistance, including hydrolytic stability and thermal stability in both oxidizing and reducing atmospheres. It has a very low dielectric constant and shows little tendency to take up water vapor from the surroundings.

In one particularly preferred variation of the present invention, the coating is used to form a negative resin. When this is desired, after the coating operation and prior to the heat curing, the coating is exposed to image-wise radiation, for example, radiation through a mask to either ultra violet light or electron beam radiation. The portions of the coating which are irradiated are crosslinked, thereby generating a pattern which is easily developed out by treatment with an organic solvent, for example, a 10-second rinse in toluene. The exposed areas, because they have been crosslinked, become insoluble and show little evidence of dimension change during development. The fully developed pattern can then be cured at elevated temperature, for example, up to about 350° C. The fully cured image pattern is very resistant to plasma etching; this resistance is still an additional unexpected advantage of the present invention.

BEST MODE FOR CARRYING OUT THE INVENTION

EXAMPLE 1

The H-Resin powder is dissolved in diglyme at a solid concentration of 40–50%. Solution is coated by spinning onto a substrate at 2000–4000 rpm, giving a film thickness of 1–5 microns. Film is then baked at 100° C. for 10 minutes on a hot plate, and then cured under nitrogen in a furnace for 30 minutes at 250° C. and 30 minutes at 350° C.

EXAMPLE 2

For use as a functional resist, the material is applied in the same manner by spinning onto a wafer (substrate) at 2000–4000 rpm. To provide a better adhesion, a silane coupling agent is applied from a 1% solution of a A-1100 in water. Then the film is exposed to ultra violet or E-beam radiation. The radiation sensitivity of the H-Resin can be enhanced by adding an appropriate material to sensitize the resin. The film is then developed without any prebaking. A fully developed film is then baked at 100° C. for 10 minutes followed by 250° C. for 30 minutes and 350° C. for 30 minutes under nitrogen.

We claim:

1. A process for forming a selectively patterned protective layer on an integrated circuit device by the steps of:
    (1) coating an acetylene terminated branched polyphenylene prepolymer material on the device,
    (2) patternwise selectively exposing the coating to radiation so as to crosslink the exposed portions,
    (3) removing the unexposed portions of the coating with a solvent, and
    (4) then heating the coating to form a thermoset cross-linked pattern protective layer.

2. A process as claimed in claim 1 wherein the radiation is ultra violet light.

3. A process as claimed in claim 1 wherein the radiation is a beam of electrons.

* * * * *